United States Patent
Leobandung et al.

(10) Patent No.: US 9,728,671 B2
(45) Date of Patent: Aug. 8, 2017

(54) MONOLITHIC NANO-CAVITY LIGHT SOURCE ON LATTICE MISMATCHED SEMICONDUCTOR SUBSTRATE

(71) Applicant: INTERNATIONAL BUSINESS MACHINES CORPORATION, Armonk, NY (US)

(72) Inventors: Effendi Leobandung, Stormville, NY (US); Ning Li, White Plains, NY (US); Tak H. Ning, Yorktown Heights, NY (US); Jean-Oliver Plouchart, New York, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 12 days.

(21) Appl. No.: 14/541,986

(22) Filed: Nov. 14, 2014

(65) Prior Publication Data

US 2016/0141836 A1    May 19, 2016

(51) Int. Cl.
| | |
|---|---|
| *H01L 21/00* | (2006.01) |
| *H01L 33/00* | (2010.01) |
| *H01L 33/06* | (2010.01) |
| *H01L 33/10* | (2010.01) |
| *H01L 33/24* | (2010.01) |
| *H01L 33/30* | (2010.01) |
| *H01L 33/40* | (2010.01) |
| *H01S 5/042* | (2006.01) |
| *H01S 5/10* | (2006.01) |
| *H01S 5/22* | (2006.01) |

(Continued)

(52) U.S. Cl.
CPC .......... *H01L 33/0062* (2013.01); *H01L 33/06* (2013.01); *H01L 33/10* (2013.01); *H01L 33/24* (2013.01); *H01L 33/30* (2013.01); *H01L 33/40* (2013.01); *H01S 5/0425* (2013.01); *H01S 5/1039* (2013.01); *H01S 5/1042* (2013.01); *H01S 5/22* (2013.01); *H01S 5/343* (2013.01); *H01L 33/44* (2013.01)

(58) Field of Classification Search
CPC . H01S 5/1042; H01S 5/10; H01S 5/22; H01S 5/0425; H01S 5/343; H01S 5/1039
See application file for complete search history.

(56) References Cited

U.S. PATENT DOCUMENTS

| | | |
|---|---|---|
| 6,301,282 B1 | 10/2001 | Capasso et al. |
| 7,010,183 B2 | 3/2006 | Estes et al. |
| 7,569,188 B2 | 8/2009 | Stockman et al. |

(Continued)

OTHER PUBLICATIONS

Ding et al.—Metallic subwavelength-cavity semiconductor nanolasers, Light: Science and Applications, 2012 1, e20.*

(Continued)

*Primary Examiner* — Reema Patel
*Assistant Examiner* — Syed Gheyas
(74) *Attorney, Agent, or Firm* — Tutunjian & Bitetto, P.C.; Louis J. Percello (57) ABSTRACT

An optoelectronic light emission device is provided that includes a gain region of at least one type III-V semiconductor layer that is present on a lattice mismatched semiconductor substrate. The gain region of the type III-V semiconductor layer has a nanoscale area using nano-cavities. The optoelectronic light emission device is free of defects.

6 Claims, 7 Drawing Sheets

(51) Int. Cl.
*H01S 5/343* (2006.01)
*H01L 33/44* (2010.01)

(56) References Cited

U.S. PATENT DOCUMENTS

| | | |
|---|---|---|
| 8,368,050 B2 | 2/2013 | Fattal et al. |
| 8,509,276 B2 | 8/2013 | Zhang et al. |
| 2008/0032478 A1* | 2/2008 | Hudait .............. H01L 21/02381 438/285 |
| 2014/0353712 A1* | 12/2014 | Chang-Hasnain .... H01S 5/1042 257/103 |

OTHER PUBLICATIONS

Ding, K., et al., "Record performance of electrical injection sub-wavelength metallic-cavity semiconductor lasers at temperature," Optics Express, vol. 21, No. 4, 2013, pp. 4728-4733.

Hill, M. T., et al., "Lasing in metallic-coated nanocavities," Nature Photonics, vol. 1, No. 10, 2007, pp. 589-594.

Kaspar, P., et al., "Hybrid III-V/silicon lasers," ISPIE Photonics Europe, 2014 913302, 8 pages.

Ma, R., et al., "Room-temperature sub-diffraction-limited plasmon laser by total internal reflection.," Nature Materials, vol. 10, Dec. 2010. pp. 110-113.

Noginov, M. A., et al., "Demonstration of a spaser-based nanolaser," Nature, vol. 460, No. 7259, 2009, pp. 1110-1112.

Oulton, R., et al., "Plasmon lasers at deep subwavelength scale," Nature, vol. 461, Oct. 2009. pp. 629-632.

Van Der Tol, J., et al., "Photonic integration in indium-phosphide membranes on silicon (IMOS)," SPIE OPTO, 89880M, 17 pages.

Cooke, M., "Monolithic InGaAs nanolaser on silicon" Semiconductor Today (Mar. 2011) pp. 106-107, vol. 6, issue 2.

\* cited by examiner

MONOLITHIC NANO-CAVITY LIGHT SOURCE ON LATTICE MISMATCHED SEMICONDUCTOR SUBSTRATE

BACKGROUND

Technical Field

The present disclosure relates to semiconductor devices, such as optoelectronic light emission devices composed of III-V semiconductor materials, and their integration with other electronic devices.

Description of the Related Art

The dimensions of semiconductor field effect transistors (FETs) have been steadily shrinking over the last thirty years or so, as scaling to smaller dimensions leads to continuing device performance improvements. With increasing scaling of semiconductor devices, the interconnects have also been decreasing in size. Typically, as the interconnect size has decreased, the resistance of the interconnects has increased. With increased scaling of semiconductor devices leading to increased switching speeds, the obstruction to further performance enhancements is the speed at which data signals can be transmitted over interconnects. Optical interconnects are preferred over electrical interconnects in many cases. Monolithic integration of III-V light source on Si substrate offer advantages of easy fabrication, reduced packaging steps, high packing density, high design flexibilities, etc.

SUMMARY

In one aspect, an optoelectronic light emission device is provided that includes gain region of at least one type III-V semiconductor layer that is present on a semiconductor substrate, wherein the gain region of the type III-V semiconductor layer has a nanoscale area. The semiconductor substrate may be composed of a type IV semiconductor material, such as a silicon containing material or a germanium containing material. In other embodiments, the semiconductor substrate may be composed of a type III-V semiconductor material that has a different lattice dimension that the at least one type III-V semiconductor material layer that provides the gain region.

In another embodiment, an optoelectronic light emission device is provided that includes a gain region of at least one type III-V semiconductor layer that is present on a semiconductor substrate, wherein the gain region has a nanoscale area. A metal layer is on top of the device or in close proximity of the device area to construct a plasmonic resonance structure.

In another embodiment, an optoelectronic light emission device is provided that includes a gain region of at least one type III-V semiconductor layer that is present on a semiconductor substrate, wherein the gain region has a nanoscale area. A metal layer is surrounding the device area to form a metal cavity, but without making a plasmonic resonance structure In another embodiment, the optoelectronic light emission device may also include a waveguide comprised of a metal layer that is present on an insulator layer, wherein the insulator layer is present on the at least one type III-V semiconductor layer to provide a waveguide arrangement for a nanocavity device.

In another aspect, a method of forming an optoelectronic light emission device is provided that includes forming a pedestal of at least one type III-V semiconductor layer on a semiconductor substrate, wherein the pedestal of the at least one type III-V semiconductor layer has a nanoscale area, and provides the gain region of the optoelectronic light emission device. The method may further include forming a metal electrode on a surface of the at least one type III-V semiconductor layer having the nanoscale area that is opposite the surface of the at least one type III-V semiconductor layer that is present on the type IV semiconductor substrate.

In another embodiment, the method of forming the optoelectronic light emitting devices includes forming a dielectric material having an opening with a nanoscale area to a semiconductor substrate. At least one III-V semiconductor material layer may be epitaxially formed on the semiconductor substrate having the nanoscale area to provide the gain region of the optoelectronic light emission device. A metal electrode is formed on a surface of the at least one type III-V semiconductor layer having the nanoscale area.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE
PREFERRED EMBODIMENTS

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on", and "over" mean that a first element, such as a first structure, is present on a second element, such as a second structure, wherein intervening elements, such as an interface structure, e.g. interface layer, may be present between the first element and the second element. The terms "direct contact", "directly on" and "contacting" mean that a first element, such as a first structure, and a second element, such as a second structure, are connected without any intermediary conducting, insulating or semiconductor layers at the interface of the two elements.

In some embodiments, the methods and structures disclosed herein provide optoelectronic devices, e.g., an optoelectronic light emission device, such as lasers, which are composed of type III-V semiconductor materials, and which may function as a components in an optical interconnect in the transmission of data from one semiconductor device to another across a type IV semiconductor substrate. It has been determined that data transmission across physical electrical communication structures, such as vias, lines, and bus bars, is slow when compared to data transmission using optical interconnects, i.e., data via transmission of light signals. In some embodiments, the methods and structures disclosed herein act as a component that in combination with an optical receiver replace the bus-bar that typically provides for electrical communication between semiconductor devices in a complementary metal oxide semiconductor (CMOS) arrangement with an optical interconnect to increase the speed of data transmission to and from the semiconductor devices present on the substrate.

As used herein, the term "optoelectronic light emission device" denotes a semiconductor light emitting structure, such as a laser diode or a light emitting diode (LED). As used herein, the term "LED" denotes a semiconductor material containing structure that emits light when an electrical current is passed through it. In some embodiments, the light-emitting diode (LED) is a two-lead semiconductor light source, which can resemble a pn-junction diode. In this example, when a voltage is applied to the leads to the pn-junction type diode, electrons are able to recombine with electron holes within the device, releasing energy in the form of photons. The laser diode is an electrically pumped semiconductor laser in which the active medium is formed by a p-n junction of a semiconductor diode similar to that found in a light-emitting diode. A laser diode is electrically a p-i-n diode. The active region of the laser diode is in the intrinsic (I) region, and the carriers, electrons and holes, are pumped into it from the N and P regions (n-type doped regions or p-type doped regions) respectively, also referred to herein as the first III-V semiconductor material layer and second III-V semiconductor material layer.

Although most solid-state lasers consist of a number of discrete elements (e.g. of a laser crystal or glass, some laser mirrors, and possibly additional intracavity optical elements), there are some types of lasers that are monolithic. Monolithic integration means that everything is on the same chip at the stage of material growth. The contrary is hybrid integration, where various devices are put together through bonding or some kind of packaging.

It has been determined that integrating III-V compound semiconductor light sources on Si substrate monolithically for optical interconnect has been problematic due to high defect densities. Two main challenges are 1) increasing the laser lifetime given the defect density in the heteroepitaxial material, and 2) reducing the laser size to save the precious chip area. In some embodiments, the present disclosure provides smaller III-V optoelectronic light emission devices, e.g., lasers and LEDs, that are comparable to or even below the light diffraction limit, monolithically on a semiconductor substrate, such as silicon to address the above problem. One reason for the short lifetime of prior optoelectronic light emission devices is the high defect density of III-V materials epitaxially grown on a semiconductor substrate, such as a Si substrate. However, the dimensions of the optoelectronic light emission devices are reduced to the dimensions disclosed herein, the chance of a defect hitting the optoelectronic light emission device is much reduced. For example, as the size of the optoelectronic light emission device is reduced to be much smaller than the area between defects, we can get defect free lasers. In some examples, the ultra-small size of these optoelectronic light emission devices, e.g., LED and/or lasers, also improves the integration density on chip.

In laser devices formed prior to the methods and structures disclosed herein, for an edge emitter type laser, the width of the laser may be on the order of 3 microns, the height of the laser may be on the order of 3 microns tall, and the length of the laser may be on the order of 500 microns long. An edge emitter laser (also referred to as in-plane lasers) is a type of laser, in which the laser light propagates in a direction along the wafer surface of the semiconductor chip and is reflected or coupled out at a cleaved edge. The dimensions of vertical-cavity surface-emitting lasers (VCSEL) prior to the methods and structures of the present disclosure typically have a diameter of about 10 microns, and may be about 10 microns tall. A vertical-cavity surface-emitting laser (VCSEL) is a type of semiconductor laser diode with laser beam emission perpendicular from the top surface, contrary to edge-emitting semiconductor lasers (also in-plane lasers) which emit from surfaces formed by cleaving the individual chip out of a wafer.

It has been determined that III-V semiconductor materials grown, i.e., epitaxially grown, on a type IV semiconductor material, such as silicon (Si), typically has a defect density, e.g., of dislocation defects or slip defects, of $1 \times 10^8$ cm$^{-2}$ or greater, which is equal to about 1 defect per micron squared (1 defect/$\mu m^2$). The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. The above described defect density is too great for lasers formed of epitaxial III-V semiconductor materials, such as the edge emitter type lasers and the vertical-cavity surface-emitting lasers (VCSEL) having the above described dimensions. Edge emitter type lasers and/or vertical-cavity surface-emitting lasers (VCSEL) having the above described dimensions and formed of III-V semiconductor materials having a defect density of $1 \times 10^8$ cm$^{-2}$ or greater typically result in lasers having defects present therein, which drastically reduce the operational lifetime of the lasers, and results in a low reliability laser. It is nearly impossible for conventional quantum well lasers to have reliable performance with this defect density. It takes only one defect to render a device inoperable.

The methods and structures that are disclosed herein avoid the integration of defects into lasers or LEDs composed of III-V semiconductor material layers that are epitaxially formed on a type IV substrate, such as silicon (Si). By reducing the incidence of defects in the III-V semiconductor material layers of the optoelectronic light emission device, e.g., lasers and/or LEDs, the present disclosure increases the operation lifetime of the optoelectronic light emission device, and increases the reliability of the optoelectronic light emission device. To reduce the incidence of defects in the III-V semiconductor material layers of the optoelectronic light emission device, the dimensions of the optoelectronic light emission devices provided by the present disclosure are reduced to an area of 1 micron squared (1 $\mu m^2$) or less. For example, the optoelectronic light emission device provided by the methods and structures of the present disclosure may have a width of 1 micron ($\mu m$) and a length of 1 micron ($\mu m$). In another example, the optoelectronic light emission device provided by the methods and structures of the present disclosure may have a width of 200 nanometers (nm) and a length of 1 micron ($\mu m$). For example, the gain region of the laser or LED may be processed to have the above reduced area dimensions.

Further details regarding the above described optoelectronic devices, e.g., optoelectronic light emission device, are now described with reference to FIGS. 1-14.

Figure 1A:
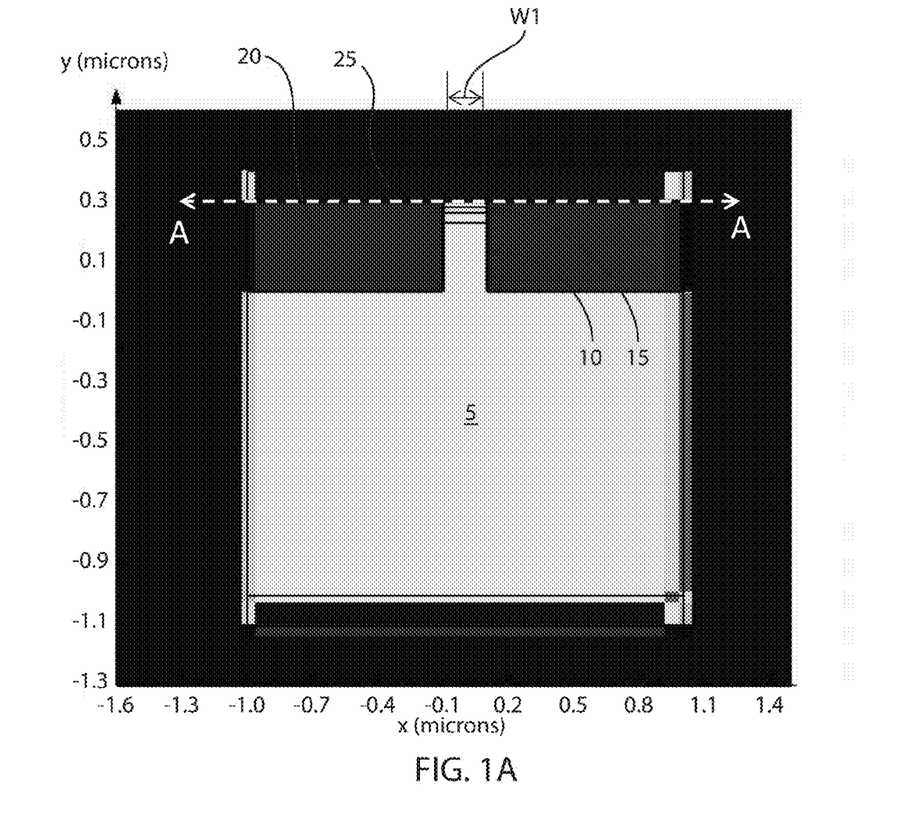
FIG. 1A is a side cross-sectional view depicting one embodiment of a monolithic III-V nanocavity light emission device on silicon using surface plasmon mode, in accordance with one embodiment of the present disclosure.
Figure 1B:
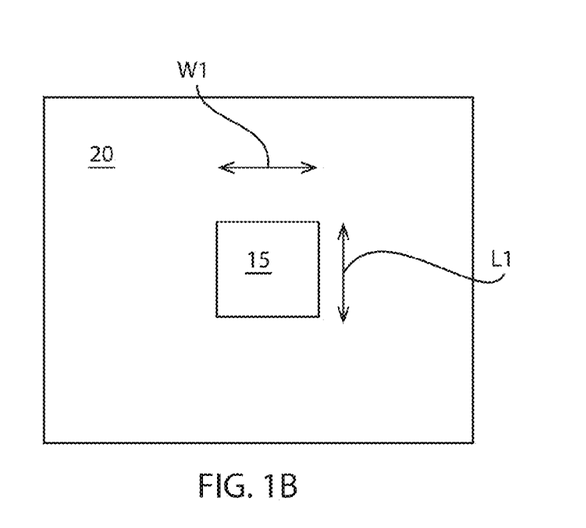
FIG. 1B is a top down view of the cross-section along section line A-A of the structure depicted in FIG. 1A

FIGS. 1A and 1B depict one embodiment of a monolithic III-V nanocavity light emission device that employs a surface plasmon mode. As suggested by this term, a plasmon involves "plasma" consisting of electrons separated from ion cores in a conducting medium. This plasma can form a charge density wave, and when this wave is localized close to the surface of the conducting medium, the resulting excitation is termed a "surface plasmon". Incident electromagnetic radiation can excite a surface plasmon under certain resonance conditions (known as "modes") that conserve energy and momentum. The electromagnetic field of the excited surface plasmon then gives rise to optical output, which is then advantageously radiated away to an emission region. The term "nanocavity" denotes that the nanoscale gain region of the optoelectronic light emission device, e.g., laser or LED, is embedded within another material, such as an insulator and/or metal.

In one embodiment, an optoelectronic light emission device, e.g., laser or LED, is provided that includes gain region of at least one type III-V semiconductor layer 15 that is present on a semiconductor substrate 5, wherein the gain region of the type III-V semiconductor layer has a nanoscale area. By "nanoscale area" it is meant that the width W1 and length L1 dimensions of the grain region of the optoelectronic light emission device when multiplied together provide a value of 1 micron squared (1 $\mu m^2$) or less. The width W1 and length L1 dimensions of the nanoscale area of the gain region of the optoelectronic light emission device are along directions that are coplanar with plane defined by the upper surface of the at least one type III-V semiconductor layer 15 as depicted by FIG. 1B, which is a top down view of the cross-section along section line A-A of FIG. 1A. The width W1 and length dimensions L1 of the nanoscale area of the gain region are perpendicular to each other.

A "gain region" is a medium which can amplify the power of light (typically in the form of a light beam). Such a gain medium is required in a laser or LED to compensate for the resonator losses, and is also called an active medium. It can also be used for application in an optical amplifier. In some embodiments, as the gain medium adds energy to the amplified light, it must itself receive some energy through a process called pumping, which may typically involve electrical currents (electrical pumping) or some light inputs (optical pumping), typically at a wavelength which is shorter than the signal wavelength.

In some embodiments, the lasers of the present disclosure may be heterojunction bulk lasers, quantum dot lasers, quantum well lasers or a combination thereof. Certain direct-bandgap semiconductors such as GaAs, AlGaAs, or InGaAs are typically pumped with electrical currents, often in the form of quantum wells (semiconductor lasers). A quantum well laser is a laser diode in which the active region of the device is so narrow that quantum confinement occurs. If the middle layer, i.e., active region, of the laser is made thin enough, it acts as a quantum well. This means that the vertical variation of the electron's wavefunction, and thus a component of its energy, is quantized. The term "quantum well" or "QW" used herein refers to a thin-layer structure comprising alternate layers consisting of a first semiconductor layer with a thickness smaller than the de Broglie wavelength of about 200 Å to 300 Å with respect to electrons or holes, and at least a second semiconductor layer with a band gap greater than that of the first semiconductor layer. The term "band gap" refers to the energy difference between the top of the valance band (i.e., Ev) and the bottom of the conduction band (i.e., Ec). The nano cavity laser disclosed herein can use any kind of carrier confinement heterojunction, e.g. conventional heterojuction laser, quantum well laser, or quantum dot laser. Here, we use quantum well laser as an example. A QW structure can be formed by sandwiching a semiconductor thin layer of a narrow band gap between semiconductor layers of a large band gap. Lasers containing more than one quantum well layer are known as multiple quantum well lasers.

If a single semiconductor thin layer constitutes a quantum well for both electrons and holes, the quantum well is called a type I quantum well. In this case, the semiconductor layer of a narrow band gap is called a well layer, and the semiconductor layers of a large band gap are called barrier layers. A type I multi-quantum well structure can be formed by alternately laminating semiconductor layers of narrow and broad band gaps. A type II quantum well structure has a first semiconductor layer forming a quantum well for electrons, a second semiconductor layer forming a quantum well for holes formed on the first semiconductor layer and third semiconductor layers sandwiching the first and second semiconductor layers as barrier layers to the electrons and holes. A type II multi-quantum well structure can be formed by alternately laminating first semiconductor layers, second semiconductor layers and third semiconductor layers. Optoelectronic light emission devices including both type I and type II quantum wells are within the scope of the present disclosure.

In one embodiment, the width W1 of the gain region for the optoelectronic light emitting devices, such as LED and laser nanocavity type devices, may range be less than 1 micron. In some embodiments, the width W1 of the gain region may range from 200 nm to 1 micron. In some other embodiments, the width W1 of the gain region may be less than 200 nm. In some examples, the width W1 of the gain region may be equal to 10 nm, 25 nm, 50 nm, 75 nm, 100 nm, 125 nm, 150 nm, 175 nm, 200 nm, 225 nm, 250 nm, 275 nm, 300 nm, 325 nm, 350 nm, 375 nm, 400 nm, 425 nm, 450 nm, 475 nm, 500 nm, 525 nm, 550 nm, 575 nm, 600 nm, 625 nm, 650 nm, 675 nm, 700 nm, 725 nm, 750 nm, 775 nm, 800 nm, 825 nm, 850 nm, 875 nm, 900 nm, 925 nm, 950 nm and 975 nm, as well as any range including a minimum value and maximum value selected from the above examples.

In one embodiment, the length L1 of the gain region for the optoelectronic light emitting devices, such as LED and laser nanocavity type devices, may be less than 1 micron. In some embodiments, the length L1 of the gain region may range from 200 nm to 1 micron. In some other embodiments, the length L1 of the gain region may be less than 200 nm. In some examples, the length L1 of the gain region may be equal to 10 nm, 25 nm, 50 nm, 75 nm, 100 nm, 125 nm, 150 nm, 175 nm, 200 nm, 225 nm, 250 nm, 275 nm, 300 nm, 325 nm, 350 nm, 375 nm, 400 nm, 425 nm, 450 nm, 475 nm, 500 nm, 525 nm, 550 nm, 575 nm, 600 nm, 625 nm, 650 nm, 675 nm, 700 nm, 725 nm, 750 nm, 775 nm, 800 nm, 825 nm, 850 nm, 875 nm, 900 nm, 925 nm, 950 nm and 975 nm, as well as any range including a minimum value and maximum value selected from the above examples.

In one example, the nanoscale area of the gain region for the optoelectronic light emitting devices, such as LED and laser nanocavity type devices, may be provided by a width ranging from 10 nm to 1 micron, and a length ranging from 10 nm to 1 micron.

In some embodiments, the dimensions of the gain region are selected to provide a an optoelectronic light emitting device having a low incidence of defects. More specifically, III-V semiconductor materials grown, i.e., epitaxially grown, on a type IV semiconductor material, such as silicon (Si), typically has a defect density, e.g., of dislocation defects, threading dislocations, stacking faults or a combination thereof, of $1 \times 10^8$ cm$^{-2}$ or greater, which is equal to about 1 defect per micron squared (1 defect/µm$^2$). By reducing the area of the gain region of the optoelectronic light emitting device, such as LED and laser nanocavity type devices, to have a microscale, i.e., be less than 1 micron squared (1 µm$^2$), the incidence of defects in this area can be substantially eliminated if not entirely eliminated.

In some embodiments, the at least one type III-V semiconductor material layer 15 that provides the gain region of the optical emission device is selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

In some embodiments, the light emission device 15, e.g., LED and/or laser nanocavity light emission device, includes a first conductivity type III-V semiconductor material layer that is present directly on buffer layer 10, a stacked structure of quantum wells comprising III-V semiconductor material layer that is present on the first conductivity type III-V semiconductor material layer, and a second conductivity type III-V semiconductor material layer that is present on the stacked structure of quantum wells. The term "conductivity type" denotes whether the semiconductor material layer has an n-type or p-type doped semiconductor material, i.e., whether the semiconductor material has a majority of p-type or n-type dopant.

The optoelectronic light emission device may be a quantum well laser, in which the wavelength of the light emitted by the quantum well laser is determined by the width of the active region rather than just the bandgap of the material from which it is constructed. The first and second conductivity type III-V semiconductor material layers, which may also be referred to as cladding layers, typically are doped to a first conductivity type and an opposing second conductivity type. For example, the first conductivity type III-V semiconductor material layer may be doped to a first conductivity, e.g., n-type conductivity, and the second conductivity type III-V semiconductor material layer may be doped to a second conductivity, e.g., p-type conductivity.

In some embodiments, the first and second conductivity type III-V semiconductor material layers function to pump charge carriers, i.e., electron and hole charge carriers, into the intrinsic active area provided by the quantum well. In some examples, the first conductivity type III-V semiconductor material layer may be composed of InP, GaAs, AlGaAs, InAlAs or a combination thereof. The dopant that provides the conductivity type, i.e., first type conductivity, e.g., n-type, of the first conductivity type III-V semiconductor material layer may be present in a concentration ranging from $10^{17}$ atoms/cm$^3$ to $10^{20}$ atoms/cm$^3$. In some examples, the first conductivity type III-V semiconductor material layer may have a thickness ranging from 100 nm to 2000 nm. In some embodiments, the second conductivity type III-V semiconductor material layer may be composed of InP or GaAs or AlGaAs or InAlAs. The dopant that provides the conductivity type, i.e., second type conductivity, e.g., p-type, of the second conductivity type III-V semiconductor material layer may be present in a concentration ranging from $10^{17}$ atoms/cm$^3$ to $10^{20}$ atoms/cm$^3$. In some examples, the second conductivity type III-V semiconductor material layer may have a thickness ranging from 100 nm to 2000 nm. It is noted that the above compositions and thicknesses are provided for illustrative purposes only, and are not intended to limit the present disclosure. For example, the first and second conductivity type III-V semiconductor material layers may be composed of any III-V compound semiconductor composition provided above.

The active region of the laser diode is in the intrinsic (I) region. By "intrinsic" it is meant that the region is not doped with an extrinsic dopant, e.g., n-type or p-type dopant, such as the dopants used to dope the first and second conductivity type III-V semiconductor material layers. The active region in the quantum well structure is formed by alternating layers of relatively low bandgap material and layers of relatively high bandgap material. As used herein, a "low bandgap" is a bandgap ranges from 0.5 eV to 3.0 eV, and a "high bandgap" ranges from 1.0 eV to 3.5 eV. The former layers are termed "well layers" and the latter layers are termed "barrier layers." For example, the active low bandgap layers comprised $Al_rGa_{1-r}As$ and the passive high bandgap layers comprised $Al_zGa_{1-z}As$ with r<z.

To provide the stacked structure of quantum wells, the thickness of each layer of III-V compound semiconductor material within the quantum well may be no greater than 50 nm. For example, the thickness for each layer of the III-V compound semiconductor material within the quantum well may range from 5 nm to 10 nm. In some embodiments, the stacked structure of quantum wells may be composed of 1 to 100 layers of semiconductor material, such as III-V compound semiconductor material. In yet another embodiment, the stacked structure of quantum wells may be composed of 1 to 5 layers of semiconductor material. In some embodiments, the quantum well (QW) layers and barrier layers of the quantum well structure 15b are formed of a semiconductor material, such as $In_xGa_{1-x}As_yP_{1-y}$, $In_xGa_{1-x}As$, $In_xGa_{1-x}N_yAs_{1-y}$, $In_xGa_{1-x}As_ySb$ (here, 0.0<x<1.0, 0.0<y<1.0).

In some embodiments, the material of the at least one III-V type semiconductor material layer 15 that provides the gain region of the optoelectronic light emitting device may have a reflective index that is higher than the buffer layer 10.

For example, the reflective index of the at least one III-V type semiconductor material layer 15 may range from 3.4 to 3.6 for GaAs/AlGaAs quantum well lasers. Referring to FIG. 1A, in some embodiments, the at least one III-V type semiconductor material layer 15 that provides the gain region of the laser or LED is present on a buffer layer 10 having a crystal lattice dimension that is between the crystal lattice dimension of the at least one type III-V type semiconductor material layer 15 and the crystal lattice dimension of the type IV semiconductor substrate 5. In some embodiments, the buffer layer 10 may be a germanium containing material layer, such as germanium (Ge), i.e., 100 at. % germanium (allowing for incidental impurities), silicon germanium (SiGe), silicon germanium doped with carbon (SiGe:C) and combinations thereof. In other embodiments, the buffer layer 10 may be composed of a type III-V semiconductor material. In some preferred embodiments, the buffer layer 18b may be composed of a semiconductor material that is selected from the group consisting of Ge, GaP, GaAs, InP and combinations thereof. The thickness of the buffer layer 10 may range from a 5 nm to 5000 nm.

In some embodiments, the material of the at least one buffer layer 10 may have a reflective index that is smaller than the gain region. For example, the reflective index of the buffer layer 10 may range from 3.0 to 3.4 for GaAs/AlGaAs lasers.

In some embodiments, the buffer layer 10 is optional and may be omitted. In the embodiments, in which the buffer layer is omitted, the at least one type III-V semiconductor material layer may be formed directly on the semiconductor substrate 5.

The semiconductor substrate 5 may be composed of a type IV semiconductor material. The term "type IV" as used to describe a semiconductor material means that the semiconductor material is in Group IV of the Periodic Table of Elements (Group 14 in accordance with the new IUPAC system). The type IV semiconductor material that provides the semiconductor substrate 5 is typically composed of a silicon containing material, such as silicon (Si), but any substrate material that meets the definition of a type IV semiconductor substrate is within the scope of the present disclosure. In some embodiments, the a type IV semiconductor substrate 5 may be composed of silicon, monocrystalline silicon, polycrystalline silicon, germanium, silicon germanium, monocrystalline silicon germanium, polycrystalline silicon germanium, silicon doped with carbon (Si:C), silicon carbide, silicon germanium doped with carbon (SiGe:C) and combinations thereof. In some embodiments, the semiconductor substrate 5 may be a lattice mismatched III-V substrate. In some examples, the semiconductor substrate may be composed of germanium (Ge), geranium on insulator (GOI) or other lattice mismatched III-V substrates.

In some embodiments, the at least one type III-V semiconductor material layer 15, and optionally the buffer layer 10 may have a pedestal configuration that is atop the semiconductor material substrate 5. In some embodiments, the pedestal is provided only by the at least one type III-V semiconductor material layer 15, wherein the pedestal of the at least one type III-V semiconductor material layer 15 is present on a buffer layer 10 that is present along an entirely of the upper surface of the semiconductor substrate 5. The pedestal may have a height of 1 micron or less.

A dielectric material 20 may be present adjacent to the pedestal of the at least one type III-V semiconductor material layer 15 and the optional buffer layer 10, wherein an upper surface of the dielectric material 20 may be coplanar with an upper surface of the at least one type III-V semiconductor material layer 15. In some examples, the dielectric material 20 may composed of an oxide, such as silicon oxide ($SiO_2$). In another example, the dielectric material 20 may be composed of a nitride, such as silicon nitride. It is noted that the above examples are provided for illustrative purposes only, and that other dielectric compositions may be suitable for the dielectric material 20. For example, the dielectric material may also be composed of silicon oxynitride, silicon carbide, hafnium oxide, aluminum oxide, aluminum nitride, amorphous silicon, silica and combinations thereof including combinations with silicon oxide and silicon nitride.

In some embodiments, the dielectric material 20 may have a reflective index that is smaller than the gain region. For example, the dielectric material 20 may have a reflective index that can ranges from 1 to 2.

A metal electrode layer 25 may be present on at least the upper surface of the at least one type III-V semiconductor material layer 15 that provides the gain region of the optoelectronic light emission device, e.g., optical laser. In some embodiments, at least a portion of the metal electrode layer 25 that extends over a portion of the dielectric material 20. The metal electrode layer 35 is typically composed of an electrically conductive material. "Electrically conductive" as used through the present disclosure means a material typically having a room temperature conductivity of greater than $10^{-8}$ $(-m)^{-1}$. For example, the metal electrode layer 25 may be composed of a metal that may include, but is not limited to, tungsten, copper, aluminum, silver, gold and alloys thereof.

In some embodiments, another electrode may be present on the backside surface of the semiconductor substrate 5. The electrode may be composed of any metal material, such as those described above for the metal electrode layer 25. It is noted that it is not necessary that this electrode be position on the backside surface of the semiconductor substrate 5, as the electrode may be positioned anywhere on the device so long as two electrodes are in electrical communication to the optoelectronic device to provide functionality.

It is noted that the above structural and compositional examples described above with reference to FIGS. 1A and 1B are provided for illustrative purposes only, and are not intended to limit the present disclosure to only the above described examples. The structures and methods of the present disclosure, are now described in more detail with reference to FIGS. 2-7.

Figure 2:
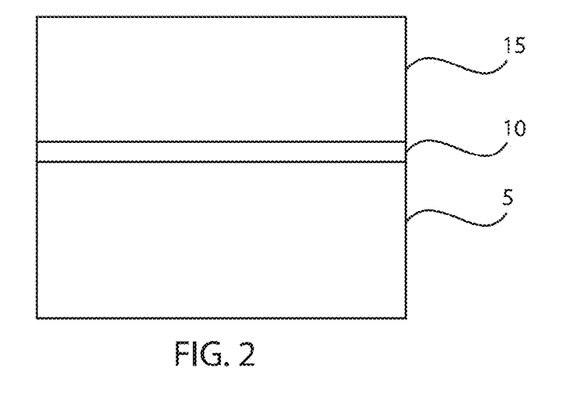
FIG. 2 is a side-cross sectional view of at least one III-V type semiconductor material layer formed on a buffer layer of a type IV semiconductor material that is present on a semiconductor substrate, in accordance with one embodiment of a method of forming a monolithic III-V nanocavity light emission device on silicon, in accordance with the present disclosure.

FIG. 2 depicts a stack structure including at least one III-V semiconductor material layer 15 formed on a buffer layer 10 of a type IV semiconductor material that is present on a semiconductor substrate 5.

The buffer layer 10 may be formed by an epitaxial deposition process on the upper surface of the type IV semiconductor substrate 5. The term "epitaxial material" denotes a semiconductor material that has been formed using an epitaxial growth and/or epitaxial deposition process. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

As described above, the semiconductor substrate 5 may be composed of a type IV semiconductor material or a type III-V semiconductor material. In some embodiments, the semiconductor substrate 5 may be a silicon containing material, such as silicon (Si). The buffer layer 10 is selected to have a lattice dimension between the lattice dimension of the semiconductor substrate 5 and the base layer of at least one type III-V semiconductor material layer 15 for the optoelectronic light emission device. By providing a lattice dimension between the semiconductor substrate 5 and the base of the optoelectronic light emission device 15, the buffer layer 10 reduces the concentration of defects and undesired stresses in the optoelectronic light emission device.

In the embodiments, in which the buffer layer 10 is comprised of germanium (Ge), the precursor gas for epitaxial deposition of a germanium containing buffer layer 10 may be selected from the group consisting of germane ($GeH_4$), digermane ($Ge_2H_6$), halogermane, dichlorogermane, trichlorogermane, tetrachlorogermane and combinations thereof. The temperature for epitaxial deposition of type III-V semiconductor materials typically ranges from 550° C. to 900° C. Although higher temperature typically results in faster deposition, the faster deposition may result in crystal defects and film cracking.

In some embodiments, the buffer layer 10 may be omitted.

The at least one type III-V semiconductor material layer 15 maybe epitaxially formed on the buffer layer 10, or directly on the semiconductor substrate 5, when the buffer layer 10 is omitted. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), tertiary-butylphosphine (TBP), phosphine ($PH_3$), ammonia ($NH_3$), and combinations thereof. To provide the material layers having different conductivities, an n-type or p-type layer may be introduced to the doped layers of the at least one type III-V semiconductor material layer 15 as they are being formed. This is referred to as being "in-situ" doped. The effect of the dopant atom, i.e., whether it is a p-type or n-type dopant, in a layer of the at least one type III-V semiconductor material layer 15 depends upon the site occupied by the dopant atom on the lattice of the base material. In a III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities.

Figure 3:
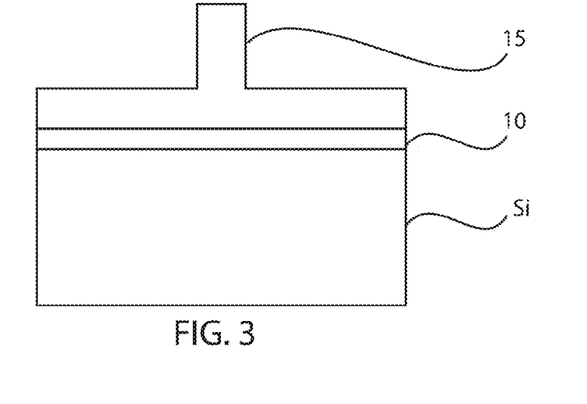
FIG. 3 is a side cross-sectional view of patterning the at least one III-V type semiconductor material layer to provide the III-V gain region of the nanocavity light emission device, in accordance with one embodiment of the present disclosure.

FIG. 3 depicts one embodiment of patterning the at least one type III-V semiconductor material layer 15 to provide the III-V gain region of the nanocavity light emission device, e.g, nanolaser or LED. The patterning of the at least one III-V semiconductor material layer 15 at this stage of the present disclosure provides the nanoscale area that is described above with reference to FIGS. 1A and 1B.

Patterning the at least one type III-V semiconductor material layer 15 may include deposition, photolithography and etch processes. Specifically, in one example, a photoresist mask (not shown) is formed overlying the upper surface of the at least one type III-V semiconductor material layer 15, in which the portion of the III-V semiconductor material layer 15 that is underlying the photoresist mask provides the pedestal portion of the III-V semiconductor material layer 15 that provides the gain region of the optoelectronic light emission device. The exposed portions of the at least one type III-V semiconductor material layer 15, which are not protected by the photoresist mask, are removed using a selective etch process.

The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

In some embodiments, the etch process for etching the at least one III-V semiconductor material layer 15 to provide the gain region of the nanolaser may be timed to thin only a portion of the at least one III-V semiconductor material layer 15 to a first depth, where a portion of the III-V semiconductor material 15 that is not etched provides a pedestal portion of the III-V semiconductor material layer having its original thickness. The pedestal portion that is not etched provides the gain region of the nanocavity light emission device, e.g., laser or LED. A remaining thickness of the etched portion (having a lesser thickness than the non-etched pedestal portion) of at least one III-V semiconductor material layer is present adjacent to the pedestal portion that provide the gain region of the laser or LED, as depicted in FIG. 3. In other embodiments, the at least one III-V semiconductor material layer 15 is etched selectively to the buffer layer 10. In the embodiments in which the buffer layer 10 is omitted, the at least one type III-V semiconductor material layer 15 may be etched with an anisotropic etch process, e.g., reactive ion etch, that is selective to the semiconductor substrate 5. Other embodiments are also contemplated in which the buffer layer 10 is also etched selective to the type IV semiconductor substrate 5. In these embodiments, the buffer layer 10 also has the geometry of the pedestal containing the etched at least one type III-V semiconductor material layer 15.

Figure 4:
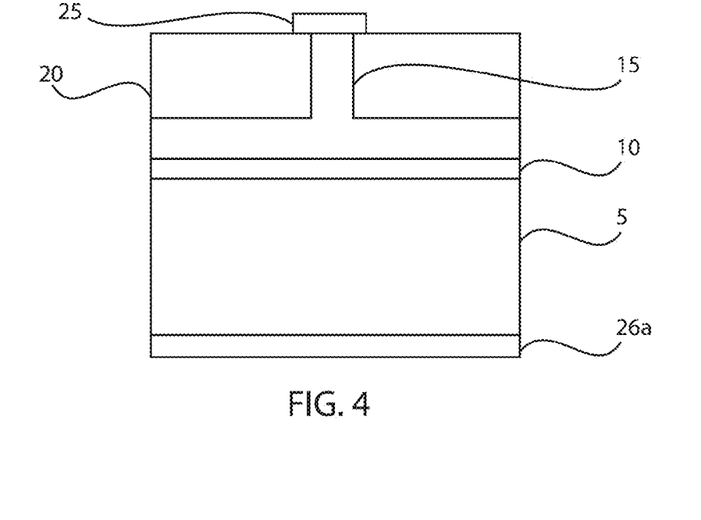
FIG. 4 is a side cross-sectional view depicting forming a dielectric material adjacent to the III-V gain region of the nanocavity light emission device having an upper surface coplanar with the upper surface of the III-V gain region, and forming a metal electrode layer on the upper surface of the III-V gain region, in accordance with one embodiment of the present disclosure.

FIG. 4 depicts forming a dielectric material 20 adjacent to the III-V gain region of the nanocavity optoelectronic light emission device, e.g., nanolaser or LED, having an upper surface coplanar with the upper surface of the III-V gain region, i.e., the upper surface of the upper most layer in the at least one type III-V semiconductor material layer 15. The dielectric material 20 may be deposited using a chemical vapor deposition process. Variations of CVD processes include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The dielectric material 20 may also be deposited using chemical solution deposition, spin or deposition, or in some cases may be formed using thermal growth processes, such as thermal oxidation, nitridation or a combination thereof. Following deposition of the dielectric material 20, the structure may be planarized using a planarization process, such as chemical mechanical planarization (CMP).

FIG. 4 further depicts forming a metal electrode layer 25 on the upper surface of the gain region provided by the at least one type III-V semiconductor material layer 15. The metal electrode layer 25 may be formed using a deposition process, such as chemical vapor deposition (CVD) or physical vapor deposition (PVD). For example, the metal electrode layer 25 may be deposited using a physical vapor deposition (PVD) process, such as plating or sputtering. In some embodiments, the metal electrode layer 25 may be deposited atop the entire upper surface provided by the coplanar upper surfaces of the dielectric material 20 and the at least one type III-V semiconductor material layer 15, as depicted in FIG. 1A, or the metal electrode layer 15 may be patterned and etched to remove at least a portion of the metal electrode layer 25 from the dielectric material 20.

Typically, an optoelectronic light emission device, such as a laser, is a two terminal device. The top electrode serves as electrical contact as well as plasmon resonant metal. The other electrode can be made on the back of the substrate, or on the front of the substrate, but provides connection to opposite side of the laser junction. FIG. 4 also depicts forming another electrode 26a may be present on the backside surface of the semiconductor substrate 5, or another electrode 26b that is present on the etched remaining portion of the at least one type III-V semiconductor material layer 15. The electrode 26a, 26b may be composed of any metal material, such as those described above for the metal electrode layer 25.

FIGS. 2-4 depict one embodiment of a method that forms an optoelectronic light emission device, e.g., LED and/or laser, using an etch down process to define the nanoscale area gain region from a stack of materials including at least one type III-V semiconductor material layer 15.

Figure 5:
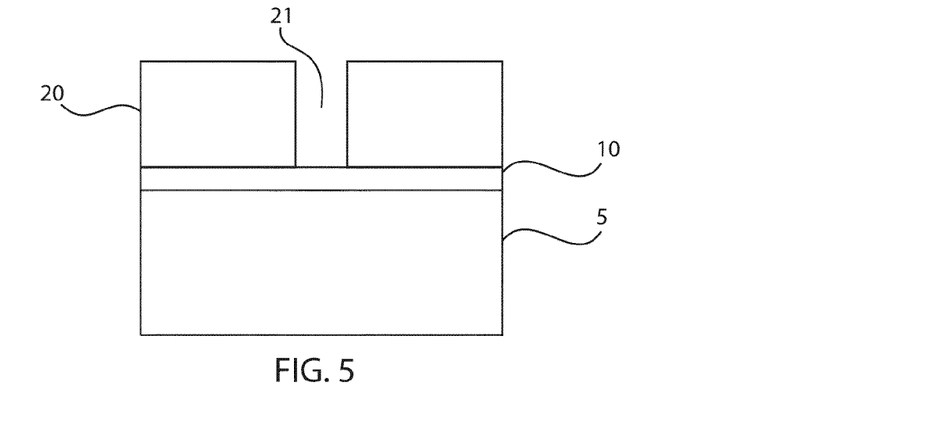
FIG. 5 is a side cross-sectional view depicting forming a dielectric material having an opening to a buffer layer and/or semiconductor substrate for forming a monolithic III-V nanocavity light emission device on silicon using surface plasmon mode, in accordance with another embodiment of the present disclosure.
Figure 6:
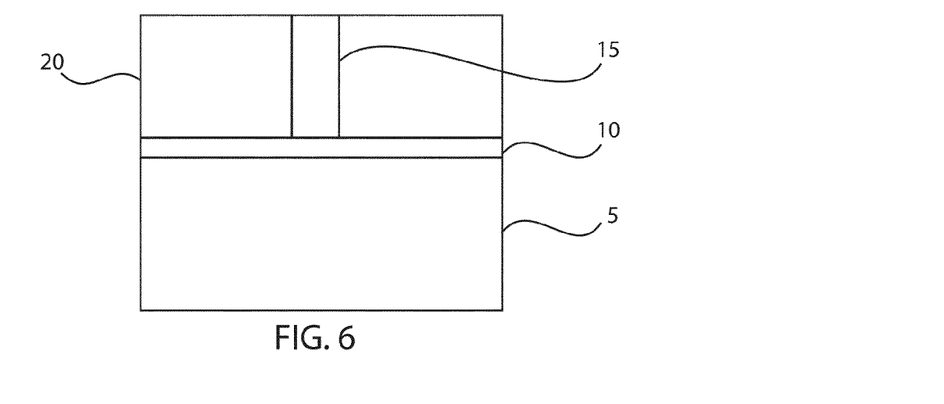
FIG. 6 is a side cross-sectional view depicting forming at least one type III-V semiconductor material layer in the opening, in accordance with one embodiment of the present disclosure.
Figure 7:
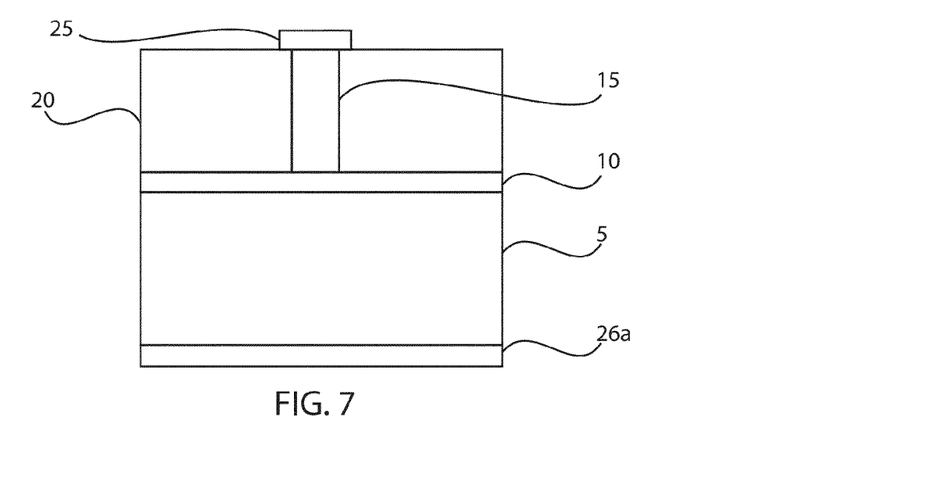
FIG. 7 is a side cross-sectional view depicting of forming a metal electrode layer on the at least one type III-V semiconductor material layer, in accordance with one embodiment of the present disclosure.

FIGS. 5-7 depict another embodiment of method of forming an optoelectronic light emission device, such as a monolithic III-V nanocavity light emission defive, on a semiconductor surface, such as silicon, that employs a surface plasmon mode, wherein the gain region of the nanoscale area is formed using a growth process into a confined area.

FIG. 5 depicts forming a dielectric material 20 having an opening 21 to a buffer layer 10 for forming the at least one type III-V semiconductor material layer 15 of the monolithic III-V nanocavity light emission device, e.g., nanolaser. The buffer layer 10 and semiconductor substrate 5 that are depicted in FIG. 5 are similar to the buffer layer 10 and the semiconductor substrate 5 that are depicted in FIGS. 1A-4. Therefore, the above description of the buffer layer 10, and its method of manufacture, as well as the semiconductor substrate 5, that is provided above with reference to FIGS. 1A-3 is suitable for the description of the buffer layer 10 and the semiconductor substrate 5 that is depicted in FIG. 5. In some embodiments, the buffer layer 10 may be omitted, wherein the dielectric material 20 having the opening 21 is formed directly on the semiconductor substrate 5, and the opening exposes an upper surface of the semiconductor substrate 5

The dielectric material 20 is deposited using a chemical vapor deposition (CVD) process. Variations of CVD processes that are suitable for forming the dielectric material 20 include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed.

The opening 21 may be formed in the dielectric material 20 using deposition, photolithography and etch process steps. For example, the opening 21 may be formed by forming an etch mask (not shown), e.g., photoresist etch mask, on the upper surface of the dielectric material 20. The etch mask is typically patterned to expose the portion of the dielectric material 20 that is removed by an etch process to provide the opening 21 that is exposing a portion of the buffer layer 10 and/or type IV semiconductor substrate 5. The etch process for forming the opening 21 may be an anisotropic etch, such as reactive ion etch (RIE), that may remove the material of the dielectric material 20 selectively to the buffer layer 10 and/or type IV semiconductor substrate 5.

The dimensions of the opening 21 dictate the dimensions of the gain region of the optoelectronic light emitting device that is provided by the at least one semiconductor layer 15 that is formed within the opening 21. For example, the opening 21 may have an area that is nanoscale, i.e., less than 1 micron squared (1 $\mu m^2$).

FIG. 6 depicts one embodiment of forming at least one type III-V semiconductor material layer 15 in the opening 21. In some embodiments, in which the buffer layer 10 is already present at the base of the opening 21, the at least one type III-V semiconductor material layer 15 may be epitaxially formed directly on the upper surface of the buffer layer 10. In the embodiments, in which the buffer layer 10 is not present at the base of the opening 10, wherein the opening 10 exposes a portion of the type IV semiconductor substrate 5, a buffer layer 10 may be epitaxially formed on the upper surface of the type IV semiconductor substrate 5 at the base of the opening 21. The buffer layer 10 may be formed using an epitaxial deposition process, as described above with reference to FIG. 2. In other embodiments, the buffer layer 10 may be omitted. In the embodiments, in which the buffer layer 10 is omitted, the at least one type III-V semiconductor material layer 15 may be epitaxially formed directly on the exposed upper surface of the semiconductor substrate 5 that is present within the opening 21.

The at least one type III-V semiconductor material layer 15 may be formed filling the opening 21 using an epitaxial deposition process. Because the at least one type III-V semiconductor material layer 15 is filling an opening 21 having a nanoscale or less area, e.g., less than 1 micron squared (1 $\mu m^2$), the gain region that is provided by the at least one type III-V semiconductor material layer 15 also have an area of nanoscale or less. The epitaxial material that provides the at least one type III-V semiconductor material layer 15 is formed using a selective deposition process. The epitaxial material will only be formed on exposed semiconductor surfaces, i.e., the exposed portion of the buffer layer 10 within the opening. The epitaxial material will not be formed on dielectric surfaces, such as the upper surface of the dielectric material 20. The epitaxial deposition process for forming the at least one type III-V semiconductor material layer 15 within the opening 21 is similar to the epitaxial deposition process for forming the at least one type III-V semiconductor material layer 15 that is depicted in FIG. 2. Therefore, the above description of epitaxial deposition of the III-V semiconductor material layers 15 for forming components of the monolithic III-V nanolaser depicted in FIG. 2 is suitable for a description of epitaxially depositing the at least one type III-V semiconductor material layer 15 within the opening 2 depicted in FIG. 6.

Following the formation of the at least one type III-V semiconductor material layer 15, a planarization process, such as chemical mechanical planarization may be applied to the upper surface of the at least one type III-V semiconductor material layer 15 to provide an upper surface of the type III-V semiconductor material layer 15 that is coplanar with an upper surface of the dielectric material 20.

FIG. 7 depicts one embodiment of forming a metal electrode layer 25 on the upper surface of the at least one III-V semiconductor material layer 15. The metal electrode layer 25 depicted in FIG. 7 is similar to the metal electrode layer 25 that is depicted in FIG. 4. Therefore, the above description of the metal electrode layer 25 depicted in FIG. 4 is suitable for a description of the metal electrode layer 25 depicted in FIG. 7.

Typically, an optoelectronic light emission device is a two terminal device. The top electrode serves as electrical contact as well as plasmon resonant metal. The other electrode can be made on the back of the substrate, or on the front of the substrate, but provides connection to opposite side of the laser junction. FIG. 7 also depicts forming another electrode 26a may be present on the backside surface of the semiconductor substrate 5. The electrode 26a may be composed of any metal material, such as those described above for the metal electrode layer 25. Although, FIG. 7 depicts that backside electrode 26a, the function of this electrode may be served by electrodes formed on other portions of the device similar to the arrangement depicted in FIG. 4.

In one example, the structure and process of making defect free optoelectronic light emission devices, e.g., nanocavity lasers and/or LEDs, of type III-V semiconductor material layers on lattice mismatched substrates, such as silicon substrates that has been described above with reference to FIGS. 1-7 provides devices that may have an output power exceeding 100 $\mu W$, which is suitable for many optical interconnect or sensing applications. The size of the optoelectronic light emission device, e.g., nanocavity laser and/or nanocavity LED, can be smaller than 200 nm×200 nm, which is and area of $\frac{1}{25}$ mm$^2$. On average, 24 out of 25 lasers that are manufactured using the methods disclosed herein are defect free. These optoelectronic light emitting devices, e.g., lasers and LEDs, can also be directly modulated to high bitrate exceeding 40 GHz, as a directly modulated high speed communication light source.

Figure 8A:
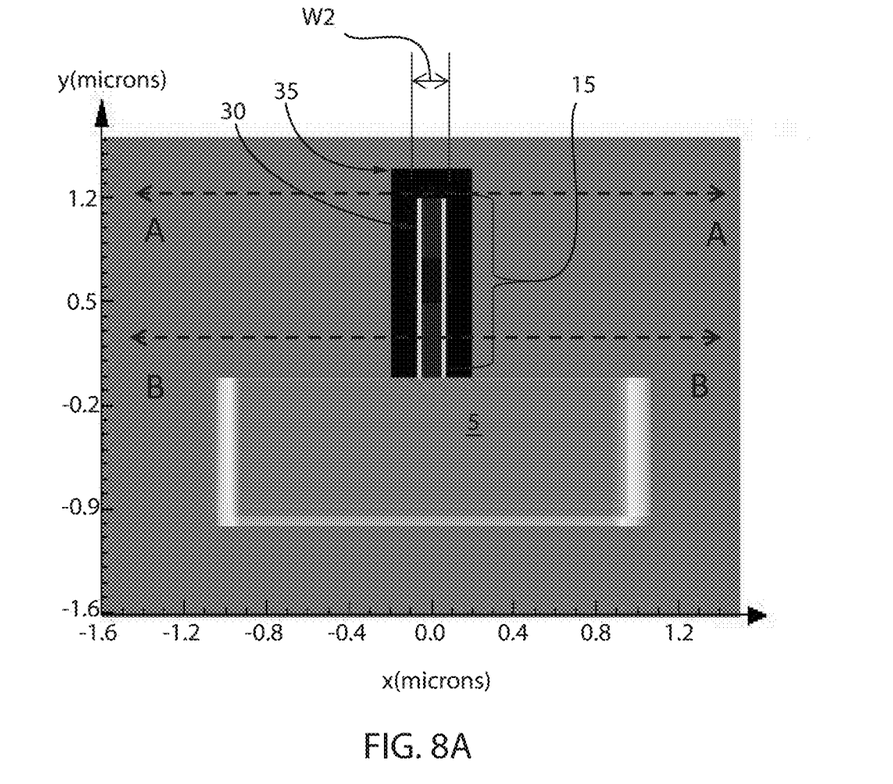
FIG. 8A is a side cross-sectional view depicting one embodiment of a monolithic III-V nanocavity light emission device on silicon, e.g., a nanolaser, using a metal layer and a dielectric layer to provide a waveguide arrangement, in accordance with one embodiment of the present disclosure.
Figure 8B:
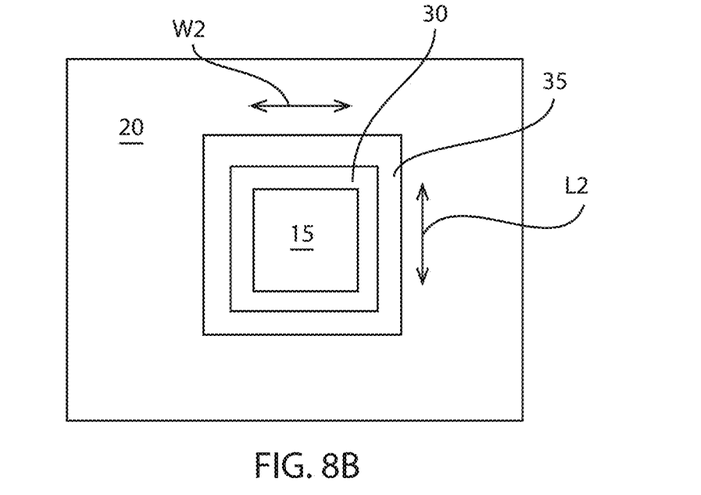
FIG. 8B is a top down view of the cross-section along section line A-A of the structure depicted in FIG. 8A.

FIGS. 8A and 8B depict one embodiment of a monolithic III-V nanocavity light emission device, such as a nanolaser or LED, that is present on a semiconductor substrate such as a silicon substrate, in which a waveguide is provide by an arrangement of insulating layers 30 and metal layers 35. In one example, the nanocavity device may be provided by a metal-insulator-silicon-insulator-metal (MISIM) waveguides, which is a hybrid plasmonic waveguide, wherein light is typically confined to the insulator between the metal and the semiconductor, e.g., silicon (Si). The term "nanocavity" denotes that the nanoscale gain region of the optoelectronic light emission device, e.g., laser, is embedded within another material, such as an insulator and/or metal. In one embodiment, the optical emission device includes a gain region of at least one type III-V semiconductor layer 15 that is present over a type IV semiconductor substrate 5, wherein the gain region has a nanoscale area. The optical emission device may also include a waveguide that is comprised of a metal layer 35 that is present on an insulator layer 30, wherein the insulator layer 30 is present on the at least one type III-V semiconductor layer 15.

The at least one type III-V semiconductor layer 15 that provides the gain region of the optical emission device, e.g., LED or laser, that is depicted in FIGS. 8A and 8B is similar to the at least one type III-V semiconductor layer 15 that provides the gain region of the optoelectronic light emission device that is depicted in FIGS. 1A and 1B. Therefore, the above description of the at least one type III-V semiconductor layer 15 depicted in FIGS. 1A and 1B is suitable for the at least one type III-V semiconductor layer 15 that provides the gain region of the optoelectronic light emission device, i.e., laser or LED, that is depicted in FIGS. 8A and 8B. For example, the at least one type III-V semiconductor layer 15 that provides the gain region of the optoelectronic light emission device, i.e., laser or LED, depicted in FIGS. 8A and 8B has a nanoscale area. The area of the at least one type III-V semiconductor layer 15 depicted in FIGS. 8A and 8B is less than 1 micron squared (1 $\mu m^2$).

In one embodiment, the width W2 of the gain region may range be less than 1 micron. In some embodiments, the width W2 of the gain region may range from 200 nm to 1 micron. In some other embodiments, the width W2 of the gain region may be less than 200 nm. In some examples, the width W2 of the gain region may be equal to 10 nm, 25 nm, 50 nm, 75 nm, 100 nm, 125 nm, 150 nm, 175 nm, 200 nm, 225 nm, 250 nm, 275 nm, 300 nm, 325 nm, 350 nm, 375 nm, 400 nm, 425 nm, 450 nm, 475 nm, 500 nm, 525 nm, 550 nm, 575 nm, 600 nm, 625 nm, 650 nm, 675 nm, 700 nm, 725 nm, 750 nm, 775 nm, 800 nm, 825 nm, 850 nm, 875 nm, 900 nm, 925 nm, 950 nm and 975 nm, as well as any range including a minimum value and maximum value selected from the above examples.

In one embodiment, the length L2 of the gain region may be less than 1 micron. In some embodiments, the length L2 of the gain region may range from 200 nm to 1 micron. In some other embodiments, the length L2 of the gain region may be less than 200 nm. In some examples, the length L2 of the gain region may be equal to 10 nm, 25 nm, 50 nm, 75 nm, 100 nm, 125 nm, 150 nm, 175 nm, 200 nm, 225 nm, 250 nm, 275 nm, 300 nm, 325 nm, 350 nm, 375 nm, 400 nm, 425 nm, 450 nm, 475 nm, 500 nm, 525 nm, 550 nm, 575 nm, 600 nm, 625 nm, 650 nm, 675 nm, 700 nm, 725 nm, 750 nm, 775 nm, 800 nm, 825 nm, 850 nm, 875 nm, 900 nm, 925 nm, 950 nm and 975 nm, as well as any range including a minimum value and maximum value selected from the above examples.

In one example, the nanoscale area of the gain region may be provided by a width ranging from 10 nm to 1 micron, and a length ranging from 10 nm to 1 micron.

In some embodiments, the dimensions of the gain region are selected to provide a laser having a low incidence of defects. More specifically, III-V semiconductor materials grown, i.e., epitaxially grown, on a type IV semiconductor material, such as silicon (Si), typically has a defect density, e.g., of dislocation defects or slip defects, of $1 \times 10^8$ cm$^{-2}$ or greater, which is equal to about 1 defect per micron squared (1 defect/$\mu m^2$). By reducing the area of the gain region of the optoelectronic light emission device, e.g., LED or laser, to have a microscale, i.e., be less than 1 micron squared (1 $\mu m^2$), the incidence of defects in this area can be substantially eliminated if not entirely eliminated.

The semiconductor substrate 5 that is depicted in FIGS. 8A and 8B is similar to the semiconductor substrate 5 that is depicted in FIGS. 1A and 1B. For example, the semiconductor substrate 5 may be composed of a silicon containing material, such as silicon. In other examples, the semiconductor substrate 5 may be composed of germanium, germanium on insulator, or a type III-V semiconductor material having a lattice mismatch from the at least one type III-V semiconductor material layer 15.

A waveguide is provided an insulating layer 30 and a metal layer 35. The insulating layer 30 may be composed of any dielectric material, such as an oxide, nitride or oxynitride material. In some examples, the insulating layer 30 may be composed of silicon oxide, silicon nitride, silicon oxynitride, silicon carbide, hafnium oxide, aluminum oxide, aluminum nitride, amorphous silicon, silica and combinations thereof. The insulating layer 30 may include a first portion on a sidewall of the pedestal structure of the at least one type III-V semiconductor material 15, and a second portion on an upper surface of the semiconductor substrate 5, or upper surface of a buffer layer 10, that is present adjacent to the pedestal structure including the at least one type III-V semiconductor material layer 15. The two portions of the insulator layer 30 may intersect at a substantially perpendicular angle to provide an L-shaped geometry. The thickness of the insulator layer 30 may range from 1 nm to 50 nm. The insulating layer 30 may have a refractive index ranging from 1 to 3, but other values have been contemplated so long as the refractive index of the insulating layer is smaller than the refractive index of the gain region.

The metal layer 35 is typically a conformal layer that is present on at least the L-shaped geometry portions of the insulating layer 30. The metal layer 35 is typically composed of an electrically conductive material. For example, the metal layer 35 may be composed of a metal that may include, but is not limited to, tungsten, copper, aluminum, silver, gold and alloys thereof. The term "conformal" denotes a layer having a thickness that does not deviate from greater than or less than 30% of an average value for the thickness of the layer. The thickness of the metal layer 35 may range from 20 nm to 500 nm. The metal layer 35 may be Au, Ag, Ti, Al, and combinations thereof.

In one example, the sequence of the metal layer 30, the insulating layer 20, the at least one type III-V semiconductor material layer 15, the insulating layer 20 and the metal layer 30 across section line B-B depicted in FIG. 8A from left to right provides the Metal, Insulator, Semiconductor, Insulator, Metal (MISIM) waveguide arrangement. It is noted that this provides only one example of a device within the scope of the present disclosure, which is not intended to limit the nanocavity laser devices described herein.

Although not depicted in FIG. 8, a dielectric material may be present adjacent to the pedestal structure provided by the at least one type III-V semiconductor material layer 15. The dielectric material may be formed on the metal layer 30. The dielectric material is similar to the dielectric material identified by reference number 20 in FIG. 4. Therefore, the description of the dielectric material identified by reference number 20 in FIG. 4 is suitable for the dielectric material that may be formed on the metal layer 30.

Figure 9:
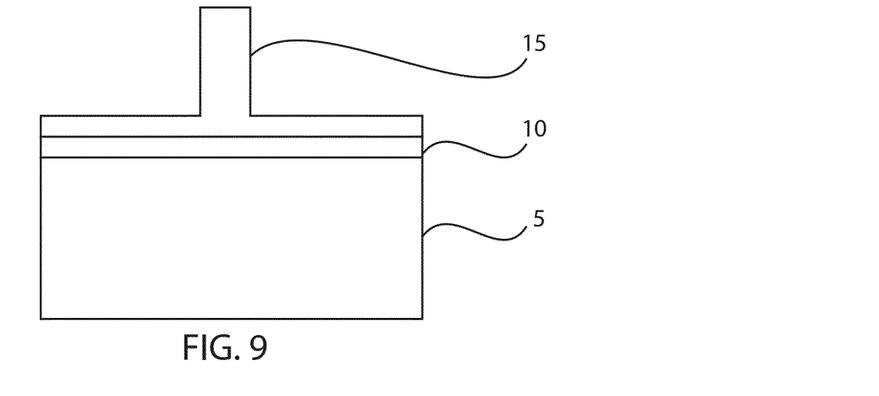
FIG. 9 is a side cross-sectional view depicting a pedestal of a type III-V semiconductor material that provides a III-V gain region as used in a process sequence for forming a nanocavity light emission device using a metal layer and a dielectric layer to provide a waveguide arrangement, in accordance to one embodiment of the present disclosure.

In another embodiment, the method of forming an optical emission device is provided that includes forming a dielectric material 30a having an opening with a nanoscale area to a semiconductor substrate 5, and forming the insulating layer and metal layer of a waveguide, as depicted in FIGS. 9-13. FIG. 9 depicts a pedestal of III-V semiconductor material 15 that provides a III-V gain region as used in a process sequence for forming a nanolaser. The method of forming the pedestal of the at least one type III-V semiconductor material layer from the stacked structure of a semiconductor substrate 5, a buffer layer 10 present on the semiconductor substrate 5, and at least one type III-V semiconductor material layer 15 that is present on the buffer layer 10 has been described above with reference to FIGS. 2 and 3.

Figure 10:
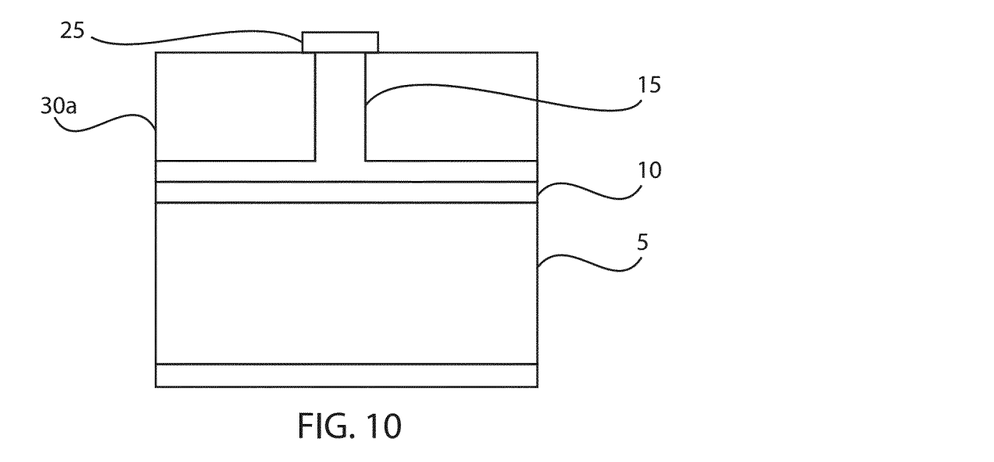
FIG. 10 is a side cross-sectional view depicting forming a first dielectric material adjacent to the III-V gain region of the nanocavity light emission device that is depicted in FIG. 9, wherein the first dielectric material has an upper surface coplanar with the upper surface of the III-V gain region; and forming a metal electrode on the upper surface of the III-V gain region, in accordance with one embodiment of the present disclosure.

FIG. 10 depicts forming a first dielectric material 30a adjacent to the type III-V gain region of the nanocavity light emission device depicted in FIG. 9, wherein the first dielectric material 30a has an upper surface coplanar with the upper surface of the at least one type III-V semiconductor material that provides the gain region of the optoelectronic light emitting device, e.g., LED or laser. The first dielectric material 30a is similar to the dielectric material 20 that has been described above with reference to FIG. 4. Therefore, the description of the dielectric material 20 that is described with reference to FIG. 4 is suitable to provide the description of the first dielectric material 30a that is depicted in FIG. 10.

FIG. 10 also depicts forming a metal electrode 25 on the upper surface of the at least one type III-V semiconductor material layer 15 that provides gain region of the optoelectronic light emitting device, e.g., LED or laser, wherein a portion of the metal electrode 25 overlies the first dielectric material 30a on both sides of the III-V gain region.

Figure 11:
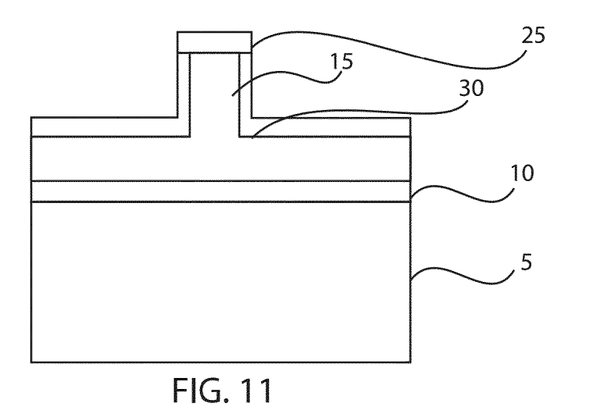
FIG. 11 is a side cross-sectional view depicting etching the first dielectric material depicted in FIG. 10 to provide an insulating layer using the metal electrode as an etch mask, in accordance with one embodiment of the present disclosure.

FIG. 11 depicts one embodiment of etching the first dielectric material 30a using the metal electrode 25 as an etch mask. The etch process for etching the first dielectric material 30a forms the insulator layer 30 of the waveguide arrangement. The etch process for etching the first dielectric material 30a may be a timed anisotropic etch process, such as reactive ion etch (RIE), so that a remaining portion of the first dielectric material is present on a vertical surface of the pedestal of the type III-V semiconductor material layer 15, and a horizontal surface of the buffer layer 10 or semiconductor substrate 5. The remaining portions of the first dielectric material intersect to provide a L-shape geometry insulator layer 30.

Figure 12:
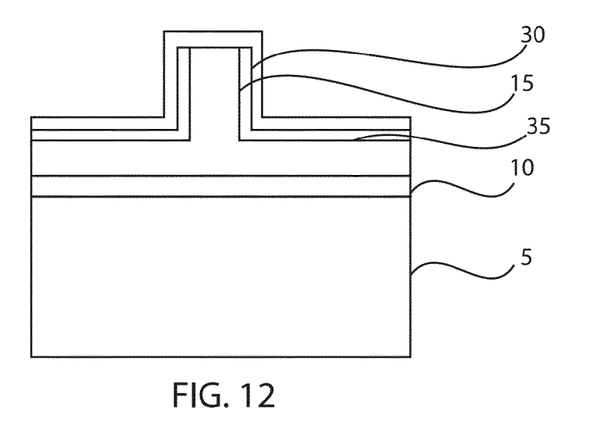
FIG. 12 is a side cross-sectional view depicting forming the metal layer on the insulating layer of the structure depicted in FIG. 11, in accordance with one embodiment of the present disclosure.

FIG. 12 depicts one embodiment of forming the metal layer 35 of the waveguide arrangement on the insulator layer 30. The metal layer 35 may be deposited using a conformal deposition process. In some embodiments, the metal layer 35 may be deposited using a physical vapor deposition (PVD) method, such as plating, electroplating, electroless plating, sputtering and combinations thereof. The metal layer 35 may be formed on the horizontal and vertical portions of the insulator layer 30. The metal layer 35 may also be formed over the electrode 25 that is present on the upper surface of the type III-V semiconductor material layer 15.

Figure 13:
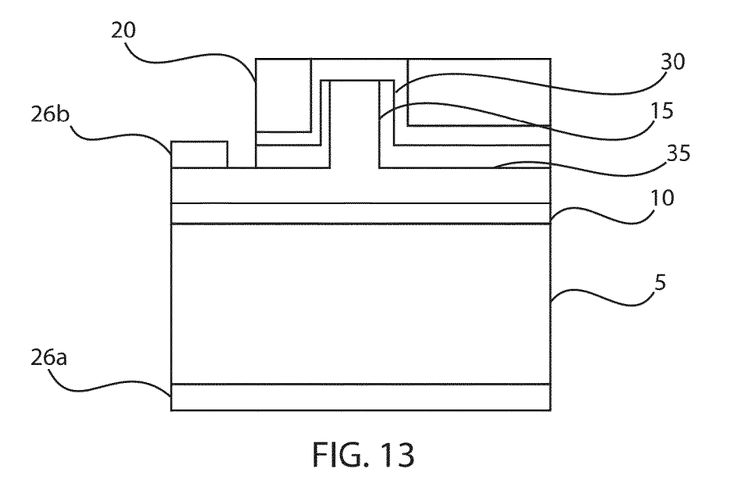
FIG. 13 is a side cross-sectional view depicting forming a second dielectric material adjacent to the III-V gain region of the nanocavity light emission device depicted in FIG. 12, wherein the second dielectric material has an upper surface coplanar with the upper surface of metal layer, in accordance with one embodiment of the present disclosure.

FIG. 13 depicts forming a second dielectric material 30b adjacent to the type III-V semiconductor material layer 15 that provides the gain region of the optoelectronic light emission device, e.g., LED or laser. The second dielectric material 20 has an upper surface coplanar with the upper surface of metal layer 30. The second dielectric material 30b is similar to the dielectric material 20 that has been described above with reference to FIG. 4. Therefore, the description of the dielectric material 20 that is described with reference to FIG. 4 is suitable to provide the description of the second dielectric material 30b that is depicted in FIG. 13.

Typically, an optoelectronic light emission device is a two terminal device. The top electrode serves as electrical contact as well as plasmon resonant metal. The other electrode can be made on the back of the substrate, or on the front of the substrate, but provides connection to opposite side of the laser junction. FIG. 13 also depicts forming another electrode 26a may be present on the backside surface of the semiconductor substrate 5, or another electrode 26b that is present on the etched remaining portion of the at least one type III-V semiconductor material layer 15. The electrode 26a, 26b may be composed of any metal material, such as those described above for the metal electrode layer 25.

FIGS. 9-13 depict one embodiment of a method that forms an optoelectronic light emitting device, e.g., laser, similar to the structure depicted in FIGS. 8A and 8B using an etch down process to define the nanoscale area gain region from a stack of materials including at least one type III-V semiconductor material layer 15.

Figure 14:
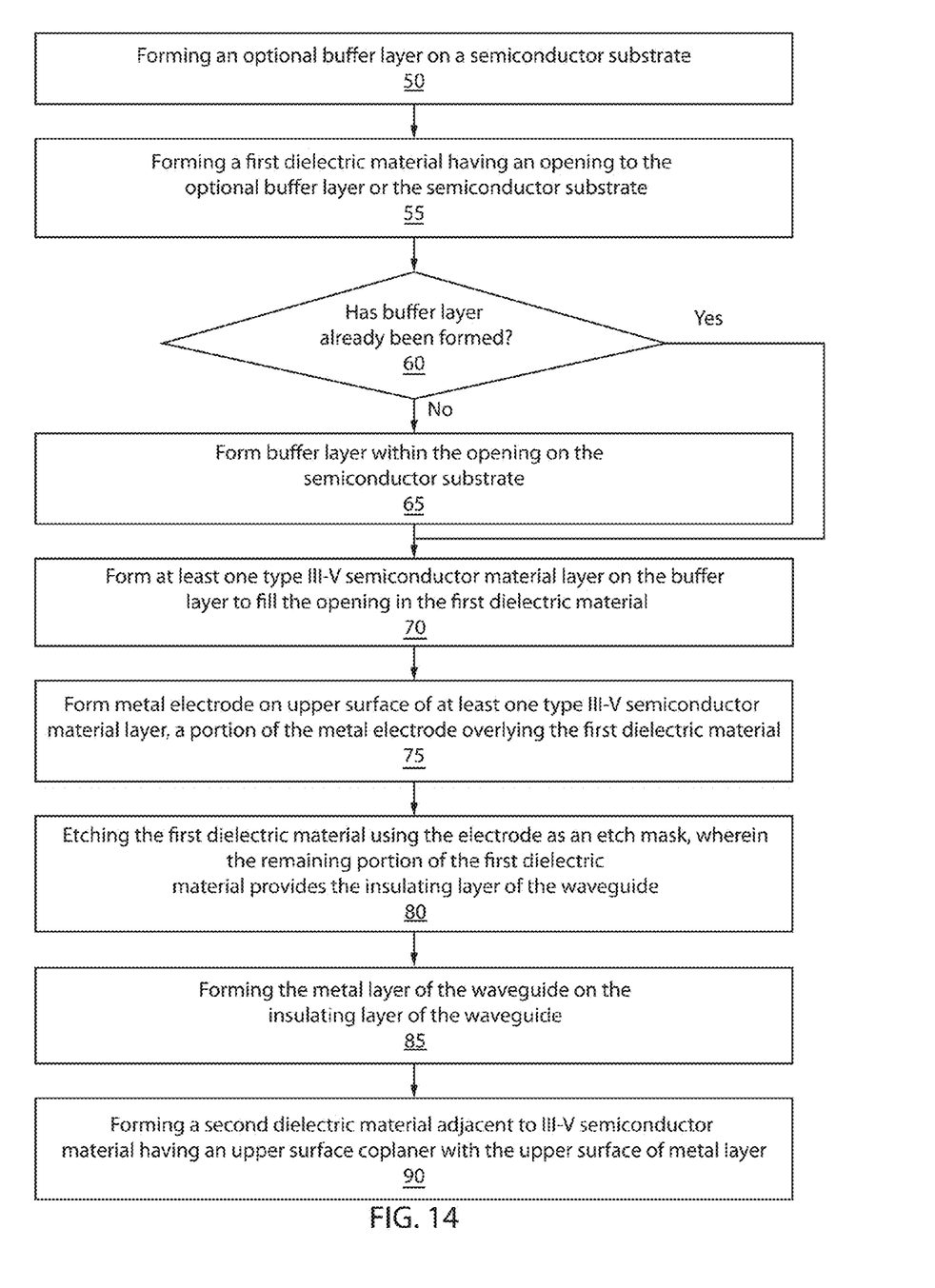
FIG. 14 is a flow chart describing another embodiment of a process sequence for forming a nanocavity light emission device, such as a nanolaser, using a metal layer and a dielectric layer to provide a waveguide arrangement, in accordance with the present disclosure.

FIG. 14 is a flow chart describing another embodiment of method of forming an optoelectronic light emitting device, such as a nanocavity type laser or LED, in which a waveguide is provide by an arrangement of insulating layers 30 and metal layers 35, wherein a gain region of the laser of nanoscale area is formed using a growth process into a confined area.

The process flow described in FIG. 14 may begin with forming an optional buffer layer on a semiconductor substrate at step 50. The buffer layer has been described in the above embodiments by the structure identified by reference number 10 and is optional. Forming buffer layer as this stage of the process flow is optional because embodiments have been contemplated in which the buffer layer is formed after the dielectric layer has been formed including the opening for containing the at least one type III-V semiconductor material layers that provide the gain region of the optoelectronic light emitting device. Embodiments have also been contemplated in which the buffer layer 10 is entirely omitted, and the at least one III-V semiconductor material layer 15 is formed directly on the semiconductor substrate 5.

In a following step 55, a first dielectric material is formed having an opening to the optional buffer layer or the type IV semiconductor substrate. This process step is similar to the process step described above with reference to FIG. 5, in which the dielectric material 20 having the opening 21 is suitable for providing the description of the first dielectric material having the opening present therein.

At step 60, a decision is made whether the optional buffer layer has been formed or not. If the buffer layer has not been formed, a buffer layer is formed at step 65 in the opening on the type IV semiconductor substrate. In some embodiments, the buffer layer is formed using an epitaxial process.

When preferred, once the optional buffer layer 10 is present at the base of the opening, the process may continue at step 70, where at least one type III-V semiconductor material layer is formed on the buffer layer filling the opening in the first dielectric material. In the embodiments, in which the buffer layer is omitted, the at least one type III-V semiconductor material layer is formed directly on the semiconductor substrate.

The at least one type III-V semiconductor material layer that is formed at this stage of the process flow is similar to the at least one type III-V semiconductor material layer 15 that has been described above with reference to FIG. 6. Therefore, the description of forming the at least one type III-V semiconductor material layer 15 that is provided above for FIG. 6, is suitable to describe the at least one type III-V semiconductor material layer that is described in step 70 of the process flow that is described with reference to FIG. 14.

In a following process step, a metal electrode is formed on the upper surface of the at least one type III-V semiconductor material layer, wherein a portion of the metal electrode is present overlying the first dielectric material, as step 75. This process step is similar to the formation of the metal electrode identified by reference number 25 in FIG. 10 of the present disclosure.

At step 80 of the process flow depicted in FIG. 14, the first dielectric material is etched using the metal electrode as an etch mask, wherein the remaining portion of the first dielectric material provides the insulating layer of the waveguide. This process step is similar to etching the first dielectric material 30a using the metal electrode 25 as an etch mask to form the insulator layer 30, as depicted in FIG. 11.

At step 85 of the process flow depicted in FIG. 14, the method may continue with forming a metal layer of the waveguide on the insulator layer. FIG. 12 depicts one embodiment of forming the metal layer 35 of the waveguide on the insulator layer 30.

At step 90 of the process flow depicted in FIG. 14, a second dielectric material is formed adjacent to the III-V semiconductor material having an upper surface that is coplanar with the upper surface of the metal layer. FIG. 13 depicts forming a second dielectric material 30b adjacent to the type III-V semiconductor material layer 15 that provides the gain region of the optoelectronic light emission device, e.g., laser or LED.

In one example, the structure and process of making defect free optoelectronic light emission devices, e.g., nano-cavity lasers and/or LEDs, of type III-V semiconductor material layers on lattice mismatched substrates, such as silicon substrates that has been described above with reference to FIGS. 8A-14 provides devices that may have an output power exceeding 100 µW, which is suitable for many optical interconnect or sensing applications. The size of the optoelectronic light emission device, e.g., nanocavity laser and/or nanocavity LED, can be smaller than 200 nm×200 nm, which is an area of ¹⁄₂₅ mm². On average, 24 out of 25 of the optoelectronic light emission devices, e.g., LEDs or lasers, that are manufactured using the methods disclosed herein are defect free. These optoelectronic light emitting devices, e.g., lasers and LEDs, can also be directly modulated to high bitrate exceeding 40 GHz, as a directly modulated high speed communication light source.

In some embodiments, the methods and structures provided herein, as described with reference to FIGS. 1-14, can provide a device size that is below a few hundred nanometers in all dimensions, so that the integration density of the devices can be very high on a semiconductor substrate, such as a silicon semiconductor substrate. The nano-cavity optoelectronic light emission devices disclosed herein can be free of defects, and thus have a long lifetime and excellent performance. Additionally, using the methods and structures disclosed herein a high-speed laser may be integrated on a semiconductor substrate, such as a silicon substrate, monolithically. The modulation speed can be multi 10s of GHz or even more than 100 GHz when the optoelectronic light emission devices of the present disclosure are integrated with silicon substrates. The LED bandwidth can also exceed 10 GHz or even 100 GHz due to enhanced spontaneous emission rate in nano-cavity devices.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An optoelectronic light emission device comprising:
a gain region of at least one type semiconductor layer that is present in direct contact with a type IV semiconductor substrate, wherein the gain region of the type semiconductor layer has a nanoscale area with a width of 200 nm or less and a length of 200 nm or less, wherein the gain region is present in a pedestal having a height or 1 micron or less, the dimensions of the gain region providing that there are no defects present in the entirety of the gain region, the at least one type semiconductor layer including an epitaxially grown layer having two thicknesses, a first thickness portion measured from an upper surface of the semiconductor substrate that provides the gain region, and a second thickness portion covering a remainder of the semiconductor substrate having a lesser thickness than the first thickness portion.

2. The optoelectronic light emission device of claim 1, further comprising a buffer layer present between the at least one type semiconductor layer and the semiconductor substrate.

3. The optoelectronic light emission device of claim 1, wherein the semiconductor substrate is comprised of a silicon containing material, a germanium containing material or a combination thereof.

4. The optoelectronic light emission device of claim 1, further comprising a metal electrode atop an upper surface of the gain region and dielectric material adjacent to the gain region, the dielectric material having an upper surface coplanar with an upper surface of the gain region.

5. The optoelectronic light emission device of claim 1, further comprising an insulating layer present on at least sidewalls of the gain region and a metal layer present on the insulating layer, wherein the insulating layer and metal layer in combination with the at least one type III-V semiconductor layer of the gain region provide a waveguide to a nanocavity device.

6. The optoelectronic light emission device of claim 1, wherein the device is a laser or a light emitting diode (LED) within a nanocavity.

* * * * *